US011322367B1

(12) United States Patent
Su et al.

(10) Patent No.: US 11,322,367 B1
(45) Date of Patent: May 3, 2022

(54) SYSTEM AND METHOD FOR ATTACHING AN INTEGRATED CIRCUIT PACKAGE TO A PRINTED CIRCUIT BOARD WITH SOLDER BALLS HAVING A COINED SURFACE PROFILE

(71) Applicant: Juniper Networks, Inc., Sunnyvale, CA (US)

(72) Inventors: Peng Su, Sunnyvale, CA (US); Bernard H. Glasauer, Saratoga, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 180 days.

(21) Appl. No.: 16/147,093

(22) Filed: Sep. 28, 2018

(51) Int. Cl.
*H01L 21/48* (2006.01)
*H01L 21/67* (2006.01)
(Continued)

(52) U.S. Cl.
CPC .... *H01L 21/4853* (2013.01); *H01L 21/67092* (2013.01); *H01L 23/49816* (2013.01); *H01L 23/562* (2013.01); *H01L 24/16* (2013.01); H01L 2224/1607 (2013.01); H01L 2224/16227 (2013.01); H01L 2924/3511 (2013.01); H05K 1/181 (2013.01); H05K 2201/10378 (2013.01); H05K 2201/10734 (2013.01)

(58) Field of Classification Search
CPC ........... H01L 21/4853; H01L 21/67092; H01L 23/49816; H01L 23/562; H01L 24/16; H01L 2224/1607; H01L 2224/16227; H01L 2924/3511; H05K 1/181; H05K 2201/10378; H05K 2201/10734
See application file for complete search history.

(56) References Cited

U.S. PATENT DOCUMENTS 5,853,517 A    12/1998   Petefish et al.
6,069,027 A *   5/2000   Mertol ............... H01L 21/50
                                                           257/E21.499
(Continued)

FOREIGN PATENT DOCUMENTS

CN        104716106 A * 6/2015 ........... H01L 23/562

OTHER PUBLICATIONS

Nah et al., "Flip Chip Assembly on PCB Substrates with Coined Solder Bumps," Saiiisung Eleclro-Mccllanics Co. Ltd.. Circuit R&D Center, 2003 Electronic Components and Technology Conference, pp. 244-249.
(Continued)

*Primary Examiner* — Steven M Christopher
(74) *Attorney, Agent, or Firm* — Shumaker & Sieffert, P.A.

(57) ABSTRACT

A method includes positioning an integrated circuit package in a coining apparatus having a fixture and a pressing plate. The integrated circuit package includes a substrate, an integrated circuit device disposed on a top surface of the substrate, and a plurality of solder balls disposed on a bottom surface of the integrated circuit package. The fixture includes a support structure and a cavity. The cavity receives the integrated circuit device while the support structure supports portions of a top surface of the integrated circuit package. The pressing plate is pressed against two or more of the solder balls, coining the two or more solder balls until each solder ball has a desired coined surface profile.

12 Claims, 5 Drawing Sheets

(51) Int. Cl.
*H01L 23/00* (2006.01)
*H01L 23/498* (2006.01)
*H05K 1/18* (2006.01)

(56) References Cited

U.S. PATENT DOCUMENTS

| | | |
|---|---|---|
| 6,508,845 B1 | 1/2003 | Tosaya |
| 8,669,137 B2 | 3/2014 | Nah et al. |
| 2008/0303142 A1* | 12/2008 | Kim ..................... H05K 3/3436 |
| | | 257/737 |
| 2010/0025863 A1* | 2/2010 | Gruber .............. H01L 23/49816 |
| | | 257/778 |
| 2012/0309187 A1* | 12/2012 | Sri-Jayantha ........... H01L 24/11 |
| | | 438/613 |
| 2017/0276871 A1* | 9/2017 | Iwata ................... G02B 6/4259 |
| 2020/0203240 A1* | 6/2020 | Haehn ................... H01L 21/563 |
| 2021/0202329 A1* | 7/2021 | Chen ....................... H01L 23/06 |

OTHER PUBLICATIONS

Nah et al., "Characterization of Coined Solder Bumps on PCB Pads," MicroScale Co. Ltd, 2002 Electronic Components and Technology Conference, 7pgs.

\* cited by examiner

SYSTEM AND METHOD FOR ATTACHING AN INTEGRATED CIRCUIT PACKAGE TO A PRINTED CIRCUIT BOARD WITH SOLDER BALLS HAVING A COINED SURFACE PROFILE

TECHNICAL FIELD

This disclosure relates to semiconductor packaging design and fabrication.

BACKGROUND

Integrated circuit (ICs) packages continue to increase in size and, as the packages increase in size, it becomes increasingly difficult to control warpage in the package. IC package sizes in excess of 75 mm per side are currently in use and larger sizes (approaching or exceeding 100 mm per side) may be required for future application specific integrated circuits (ASICs). Warpage poses a major board-assembly process challenge; it can, for instance, lead to fabrication defects during board assembly.

SUMMARY

In general, the disclosure describes techniques for controlling for improving solder ball coplanarity in IC packages. A flat surface pressed against a solder ball flattens the surface of the solder ball, a process termed "coining." Coining of solder balls in a ball grid array may be used to adjust the height of the solder balls in a ball grid array package and thus improve the overall coplanarity of the solder balls in the ball grid array.

The coining plate surface used to coin solder balls in a ball grid array may be planar or nonplanar. A planar coining plate surface pressed against the solder balls of a ball grid array, presses a coined surface of each solder ball into coplanarity. In contrast, a nonplanar coining plate surface pressed against the solder balls of a ball grid array imposes the contours of the nonplanar coining plate surface across the coined surfaces of the solder balls. A coining plate surface having a desired profile may therefore be used to impose the desired profile across the coined surfaces of the solder balls.

In one example, a method includes positioning an integrated circuit package in a fixture, wherein the integrated circuit package includes a substrate, an integrated circuit device disposed on a top surface of the substrate, and a plurality of solder balls disposed on a bottom surface of the integrated circuit package, wherein the fixture includes a support structure and a cavity, wherein the cavity receives the integrated circuit device while the support structure supports portions of a top surface of the integrated circuit package; and pressing a pressing plate against two or more of the solder balls, coining the two or more solder balls until each solder ball has a desired coined surface profile.

In another example, a coining apparatus includes a fixture configured to receive an integrated circuit package having an integrated circuit device connected through a substrate to one or more solder balls, wherein the fixture integrated circuit device is attached to a top surface of the substrate, wherein the fixture includes a supporting structure and a cavity, wherein the cavity receives the integrated circuit device while the supporting structure supports a top surface of the integrated circuit package so that the one or more solder balls are exposed; and a pressing plate set opposite the fixture and configured to press against the one or more solder balls to coin the one or more solder balls.

In yet another example, an integrated circuit package comprises a ball grid array (BGA) having a plurality of solder balls; a BGA substrate electrically connected to the ball grid array; and an integrated circuit connected through the BGA substrate to the ball grid array, wherein two or more solder balls include coined surfaces reflecting a desired coining profile.

The details of one or more examples are set forth in the accompanying drawings and the description below. Other features, objects, and advantages will be apparent from the description and drawings, and from the claims.

DETAILED DESCRIPTION

A ball grid array (BGA) package is a package having a set of conducting solder balls on an insulating substrate. Each solder ball in the BGA package may be an isolated electrical connection through a board via to a circuit node in an integrated circuit (IC) that is attached to the insulating substrate. The IC may rest on an opposite side of the insulating substrate from the BGA package, with one or more balls of the BGA package connecting to various nodes on the IC. The balls in the BGA package may be spaced in a grid array, with each row and column separated by a distance known as a pitch.

As noted above, warpage in ICs packages poses a major board-assembly process challenge. One consequence of package warpage is that solder balls attached to the surface of the IC package are not in the same plane. During the assembly process, a solder ball that is too far away from its corresponding pad on the PCB may make an incomplete connection, or no connection at all. A solder ball that is too close to its corresponding pad on the PCB may bridge two or more pads during assembly, shorting the pads.

To date, the burden of controlling warpage in IC components has been thrust on the vendors. Board manufacturers have relied on vendors to optimize packaging design and materials in order to control component warpage, requiring the vendor to meet defined limits on warpage such as, for instance, limiting warpage under certain conditions to less than 200 µm. As component sizes increase, however, such requirements may become more challenging.

Figure 1:
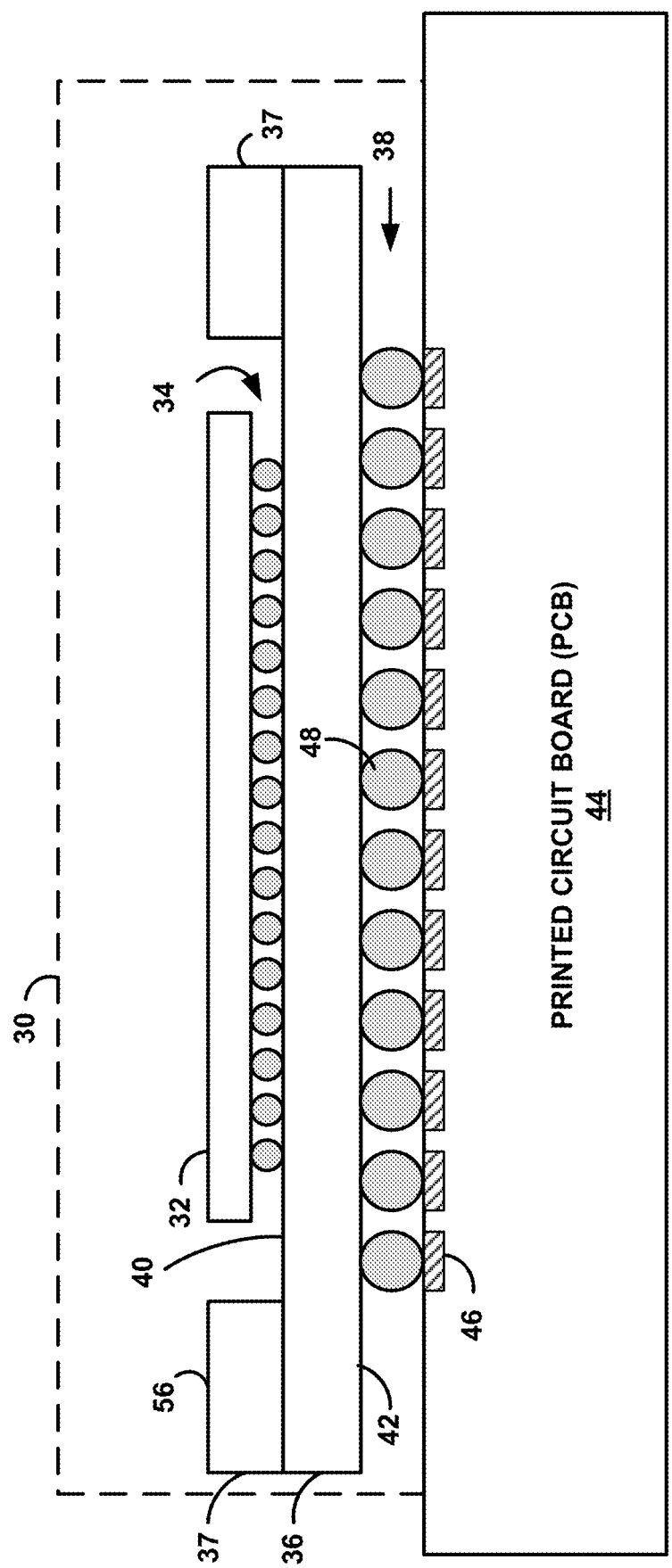
FIG. 1 is a block diagram illustrating an example ball grid array (BGA) package, in accordance with techniques of this disclosure.

FIG. 1 is a block diagram illustrating an example BGA package 30, in accordance with techniques of this disclosure. In the example approach of FIG. 1, package 30 couples an IC 32 through a BGA substrate 36 to a printed circuit board (PCB) 44. In the example approach of FIG. 1, package 30 includes IC 32, BGA substrate 36, stiffener ring 37 and a set of connectors 48 arranged as a BGA 38. In the example shown in FIG. 1, package 30 is attached to PCB 44 and may conduct electricity from BGA 38 connectors 48 (such as solder balls) attached to the bottom surface 42 of BGA package 30 using pads 46 of PCB 44. In some example approaches, stiffener ring 37 is a rectangular annulus that reduces the flexibility of BGA package 30. In the example shown in FIG. 1, stiffener ring 37 includes a top surface 56.

IC 32 may be coupled to BGA substrate 36 via solder bumps 34, which in FIG. 1 are shown as connecting the bottom surface of IC 32 to the top surface 40 of BGA substrate 36. IC 32 may employ flip-chip technology, also known as controlled collapse chip connection (C4), which may use solder bumps or copper pillars to conduct electricity between IC 32 and BGA substrate 36. Chip bumps 34 may have a pitch that is smaller than the pitch of BGA 38. In some examples, the diameter of chip bumps 34 may be on the order of one hundred micrometers. The pitch of chip bumps 34 may also be on the order of one hundred to two hundred micrometers. In some examples, wire bonds (not shown) are used instead of chip bumps 34 to connect IC 32 to BGA substrate 36. In some examples, a hat-shaped lid is attached to BGA substrate 36, replacing stiffener ring 37.

BGA substrate 36 may facilitate electrical connections between chip bumps 34 and the connectors (e.g., solder balls 48) of BGA 38. BGA substrate 36 may include conductive paths inside of or on either side of BGA substrate 36. Conductive paths inside BGA substrate 36 may include vertical paths, such as vias, or horizontal paths across BGA substrate 36. BGA substrate 36 may include through-organic substrate vias (TOSVs) that are formed by laser drilling or preforming processes.

In some examples, IC 32 may be in die form and may include separate or combined electrical circuits formed on a single piece of semiconductor such as silicon, germanium, or gallium arsenide. Examples of ICs 32 include, but are not limited to, a digital signal processor (DSP), a general purpose microprocessor, an application specific integrated circuit (ASIC), a field programmable gate array (FPGA), a combination thereof, or other equivalent integrated or discrete logic circuitry.

BGA substrate 36 may be a BGA substrate that includes organic, non-silicon insulating material. BGA substrate 36 may also include conducting material formed as pads on the top and bottom surfaces of BGA substrate 36. IC 32 may attach to BGA substrate 36 such that the pads on top surface 40 of BGA substrate 36 are electrically connected to the input/output (I/O) points of IC 32. The pads on top surface 40 of BGA substrate 36 may be coupled to solder balls 48 of ball-grid array 38 on bottom surface 42 of BGA package 30 through vias or other electrical connections. In this way, the I/O points of IC 32 may be electrically coupled through BGA substrate 36 to PCB 44. Examples of the vias through which the I/O pads of IC 32 may connect to the first BGA through BGA substrate 36 include through-organic substrate vias (TOSVs), such as laser-drilled vias, that extend through BGA substrate 36. Alternatively or additionally, the electrical connections between the I/O points of IC 32 and PCB 44 may be any other suitable connection. The electrical connections between the I/O points of IC 32 may include conductive paths through the insulating material in BGA substrate 36 or across one or both sides of BGA substrate 36, or a combination of interior and exterior conductive paths. In some example approaches, BGA substrate 36 includes vias that couple pads on top surface 40 of BGA substrate 36 to BGA 38 connectors on the bottom surface 42 of BGA substrate 36.

In some example approaches, the connectors 48 in a BGA 38 of this disclosure may be selected from connectors such as solder balls, copper bumps, or any other suitable conductive material. In some examples, BGA substrate 36 may include a land-grid array, pads, or any suitable connector instead of or in combination with BGA 38. In addition, a smaller pitch in BGA 38 may mean a higher density of connections, thereby allowing greater fan-out for IC 32. In some examples, as is shown in FIG. 1, BGA package 30 is a lidless design. Such designs improve heat dissipation at the cost of reduced stiffness.

As noted above, warpage in BGA packages 30 poses a major board-assembly process challenge that can lead to fabrication defects during board assembly and increased failure after fabrication. As noted above, as package size increases, a BGA package 30 becomes more susceptible to warpage. The newer Application Specific Integrated Circuits (ASICs) have widely adopted lidless design in BGA packages such as is shown in FIG. 1, exacerbating the problem of warpage by reducing the stiffness of BGA package 30.

As noted above, one consequence of package warpage is that solder balls 48 deposited on the surface of the IC package 30 are not in the same plane (coplanar). During the assembly process, a solder ball that is too far away from its corresponding pad 46 on the PCB may make an incomplete connection, or no connection at all. A solder ball 48 that is too close to its corresponding pad on the PCB may bridge two or more pads during assembly, shorting the pads 46.

For example, assume that a first solder ball and a second solder ball are not in the same plane such that the bottom of the first solder ball is slightly higher than the bottom of the second solder ball. In this example, the second solder ball may make good connection with its corresponding pad on PCB 44, but because the first solder ball is slightly higher, the first solder ball may make incomplete connection with its corresponding pad on PCB 44. In some cases, if the BGA package 30 is pressed down to make sure that the first solder ball makes good connection with the corresponding pad 46 on PCB 44, then the second solder ball may crack or bulge, weakening the resulting solder joint, or may bridge between two pads 46, thereby creating a short between pads. When released, BGA package 30 returns to its previous shape and may place stress on the solder join of the first solder ball.

As noted above, warpage increases as a function of package size. If measures are not taken to mitigate warpage, board assembly defects such as shorts and opens may begin to occur with increasing frequency, which may have a major impact on manufacturing quality and in-field reliability.

Furthermore, solder balls 48 cannot flex in the way that longer leads can, so they may not remain mechanically compliant. As with all surface mount devices, bending due to a difference in coefficient of thermal expansion between PCB substrate and BGA (thermal stress) or flexing and vibration (mechanical stress) can cause the solder joints to fracture post fabrication. Thermal expansion issues can be overcome to some extent by matching the mechanical and thermal characteristics of the PCB 44, by underfilling (attaching the BGA package 30 to PCB 44 by adhesive), or by adding a "compliant layer" in package 30 that allows the balls 48 to physically move in relation to package 30.

This disclosure describes example techniques for increasing coplanarity in solder balls 48. In one example approach, a flat surface pressed against a solder ball flattens the surface of the solder ball 48, a process termed "coining." The flattened surface is a "coined surface." Coining of solder balls in a ball grid array may be used to adjust the height of the solder halls in a BGA package and thus improve the overall coplanarity of the solder balls in the ball grid array by placing the coined surfaces of the solder balls in the same plane.

Figure 2:
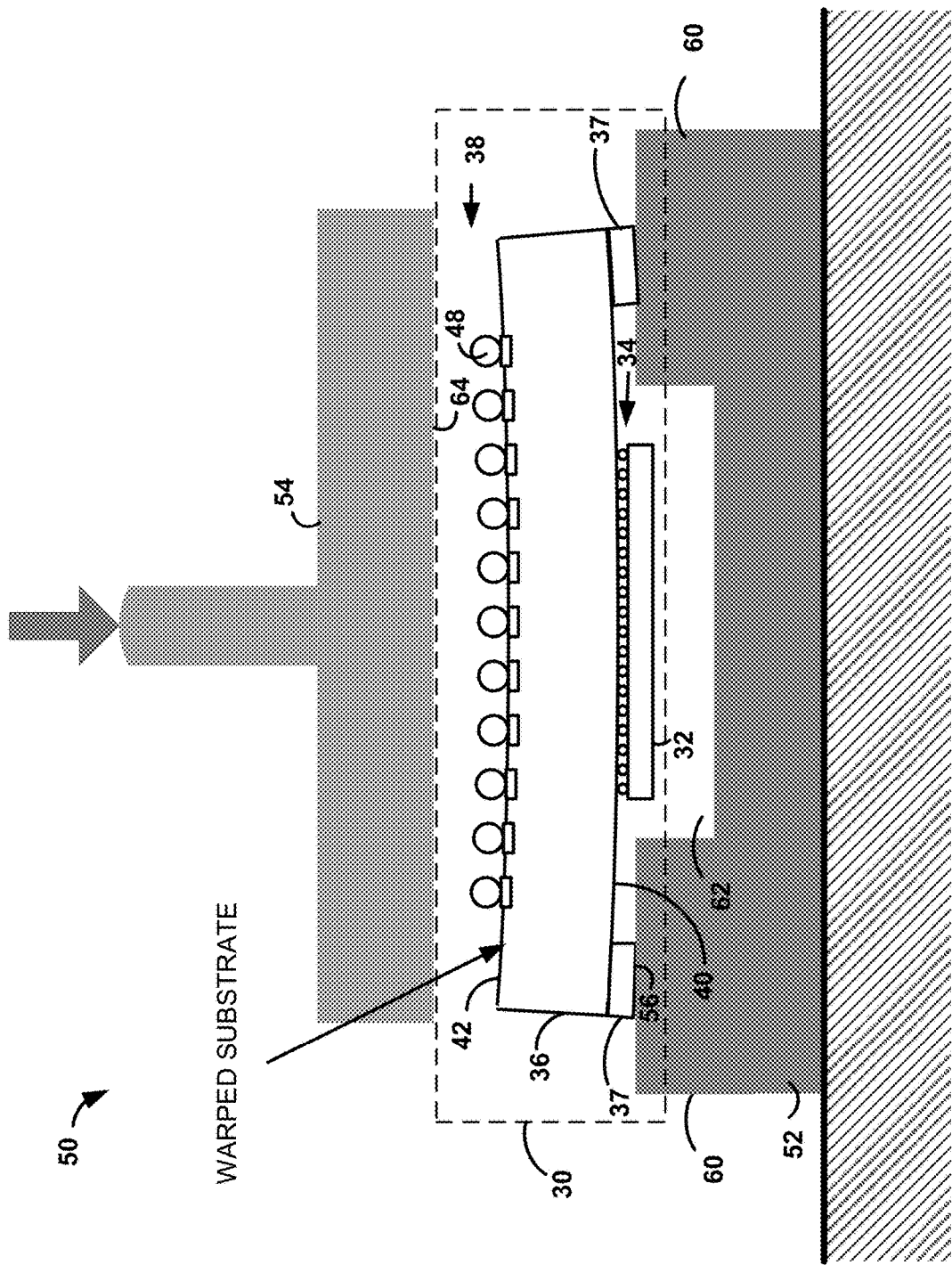
FIG. 2 is a block diagram illustrating an example approach for coining solder balls in a BGA package, in accordance with techniques of this disclosure.

FIG. 2 is a block diagram illustrating an example approach for coining solder balls 48 in a ball grid array package 30, in accordance with techniques of this disclosure. In the example shown in FIG. 2, BGA package 30 illustrates warpage consistent with doming. In the example approach of FIG. 2, a coining apparatus 50 includes a fixture 52 and a coining plate 54. Fixture 50 includes a support structure 60 having a cavity 62. In one example approach, BGA package 30 is placed in the fixture 52 such that the top surface 56 of stiffener ring 37 is supported by support structure 60 while cavity 62 receives IC device 32, preventing pressure from the coining process from being transferred to IC device 32. In lidded BGA examples, support structure 60 supports the lid while preventing pressure from the coining process from being transferred to internal IC devices such as IC device 32.

In one example approach, coining plate 54 includes a coining plate surface 64. In one such example approach, coining plate surface 64 is a flat surface that, when pressed against two or more solder balls 48 forms coplanar coined surfaces on the solder balls 48. Coining of solder balls 48 in a ball grid array 38 may be used to adjust the height of the solder balls in a ball grid array package and thus improve the overall coplanarity of the solder balls in the ball grid array.

The coining plate surface 64 used to coin solder balls 48 in a ball grid array 38 may be planar or nonplanar. A planar coining plate surface 64 pressed against the solder balls 48 of a ball grid array 38, presses a surface of each solder ball 48 into coplanarity. In contrast, a nonplanar coining plate surface 64 pressed against the solder balls 48 of a ball grid array 38 imposes the contours of the nonplanar coining plate surface 64 across the coined surfaces of the solder balls 48. A coining plate surface 64 having a desired profile may therefore be used to impose the desired profile across the coined surfaces of the solder balls. In some example approaches, coining plate surface 64 is heated to a predefined temperature before being pressed against solder balls 48.

Figure 3:
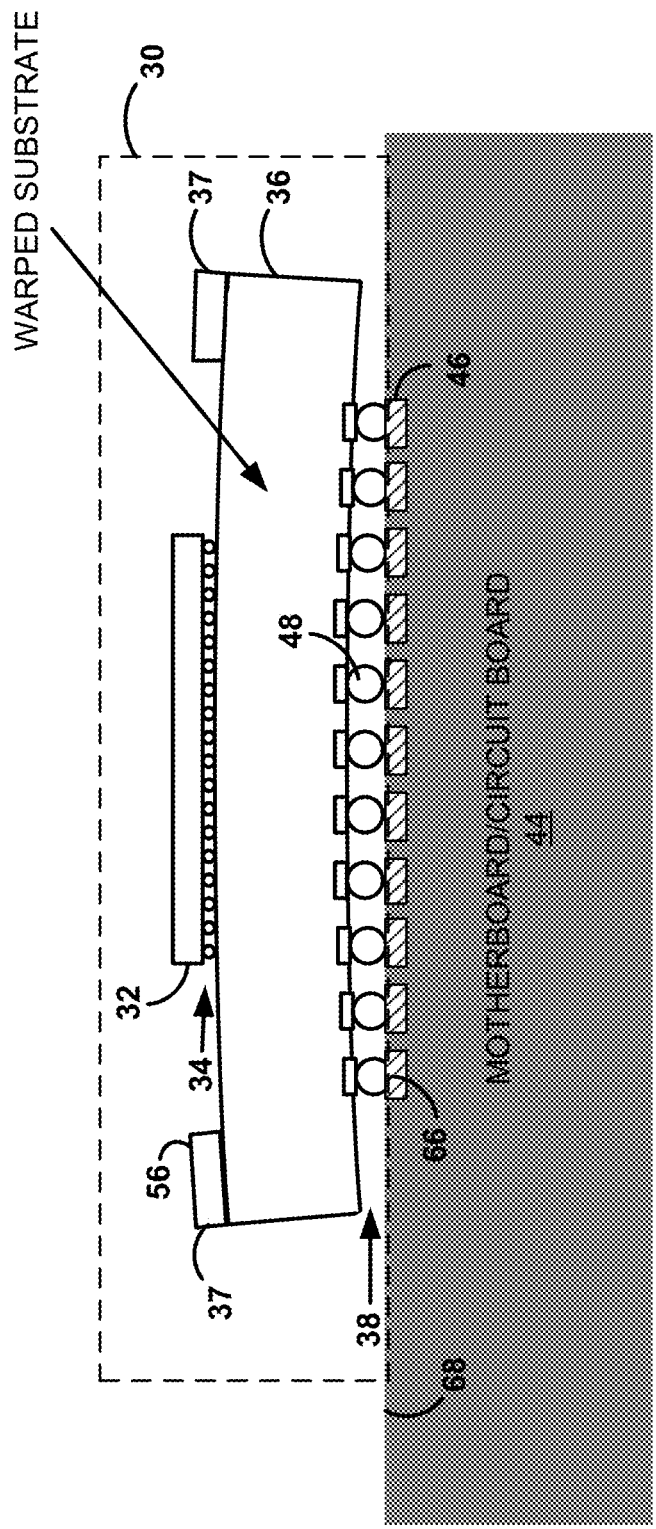
FIG. 3 is a block diagram illustrating the BGA package of FIG. 2 after coining, in accordance with techniques of this disclosure.

FIG. 3 is a block diagram illustrating the BGA package 30 of FIG. 2 after coining, in accordance with techniques of this disclosure. In the example approach of FIG. 3, solder balls 48 have each been coined to be coplanar to the top surface 68 of PCB 44. In the example shown in FIG. 3, coined surfaces 66 of solder balls 48 are coplanar and are parallel to top surface 68 of PCB 44. When attached to circuit board 44, coined surfaces 66 of solder balls 44 contact pads 46, reducing or eliminating the effects of warpage in package 30.

As noted above, a coining plate surface 64 having a desired profile may be used to impose the desired profile across the coined surfaces of the solder balls 48 of a ball grid array 38. In other example approaches, coined surfaces 66 of solder balls 48 reflect a profile representing surface 68 of PCB 44. That is, the profile used for coining plate surface 64 reflects the contours of the top surface of PCB 44. In other example approaches, coined surfaces 66 of solder balls 48 reflect a profile representing a combination of a contour associated with surface 68 of PCB 44 and warpage compensation for a BGA package 30 at a particular temperature.

Figure 4:
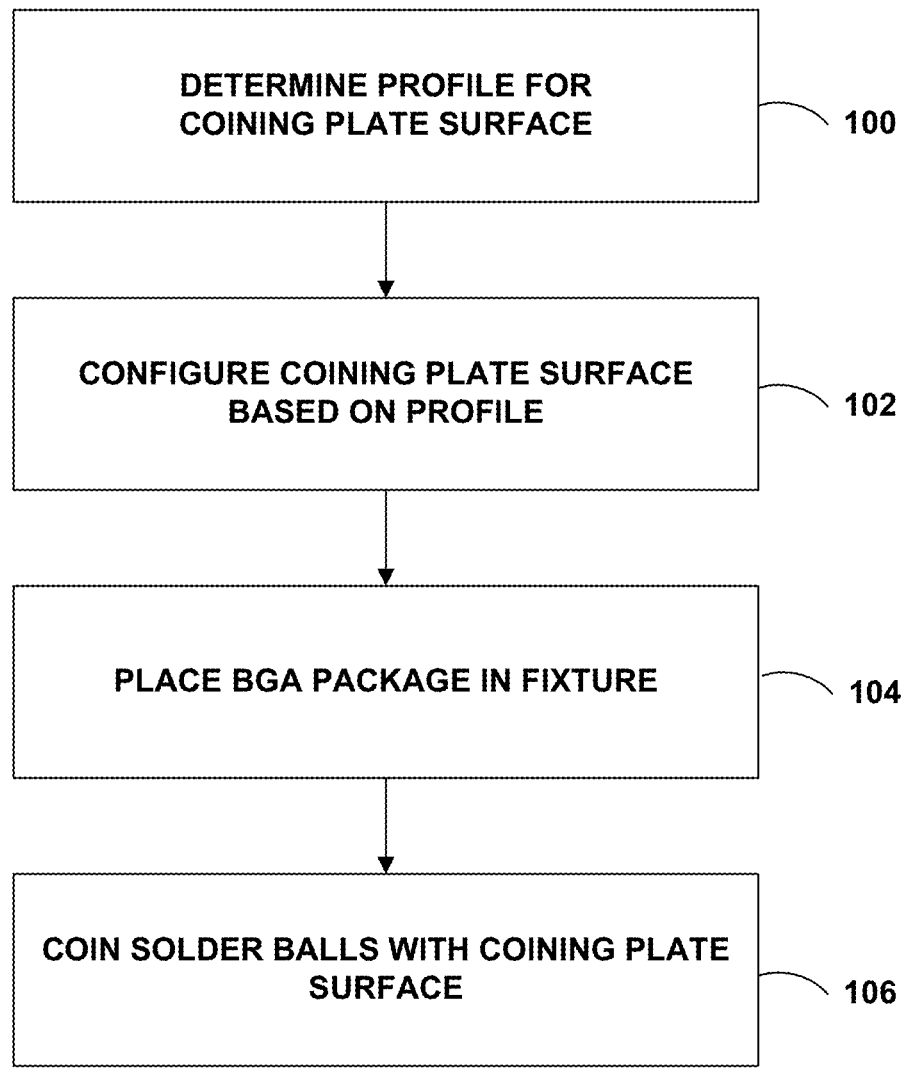
FIG. 4 is a flowchart illustrating an example method of coining, in accordance with techniques of this disclosure.

FIG. 4 is a flowchart illustrating an example method of coining, in accordance with techniques of this disclosure. In the example approach of FIG. 4, coining plate surface 64 is configured based on a profile of the surface to which BGA package 30 is to be attached. In one such example approach, a check is made to determine a profile representative of the surface to which the BGA package will be attached (100). If the surface is PCB surface 68 and the surface forms what is approximately a plane, the profile is planar. If the surface is PCB surface 68 and the surface is convex, the profile is selected to be convex. If the surface is PCB surface 68 and the surface is concave, the profile is selected to be concave. Other, more complex profiles may also be used, as further detailed below.

In one example approach, coining plate surface 64 is configured as a function of the profile (102). In some example approaches, coining plate surface 68 models PCB surface 68 at a temperature selected to represent normal operation of a device including PCB 44. In some example approaches, coining plate surface 68 models PCB surface 68 at a temperature selected to represent a typical temperature for soldering devices to surface 68 of PCB 44. Other temperatures, such as intermediate temperatures or room temperatures, may be selected as well.

BGA package 30 is placed in fixture 52 such that cavity 62 receives IC 32 (104). Coining plate surface 64 is then pressed against solder balls 48 to transfer the profile to solder balls 48 (106). In some example approaches, the coining process is optimized based on parameters such as temperature, pressure and speed of pressure application. In some example approaches, the level of coining may be controlled precisely and may, in some examples, result in solder ball coplanarity at a desired level. In other example approaches, the level of coining may be controlled precisely and may, in some examples, result in solder ball coining consistent with the profile determined at 100.

In one example approach, BGA package 30 is heated to a desired temperature prior to the coining process. Such an approach may be used, for instance, to reduce warpage in the BGA package prior to solder attachment, or to reduce the effects of differences in thermal expansion between BGA package 30 and PCB 44.

Figure 5:
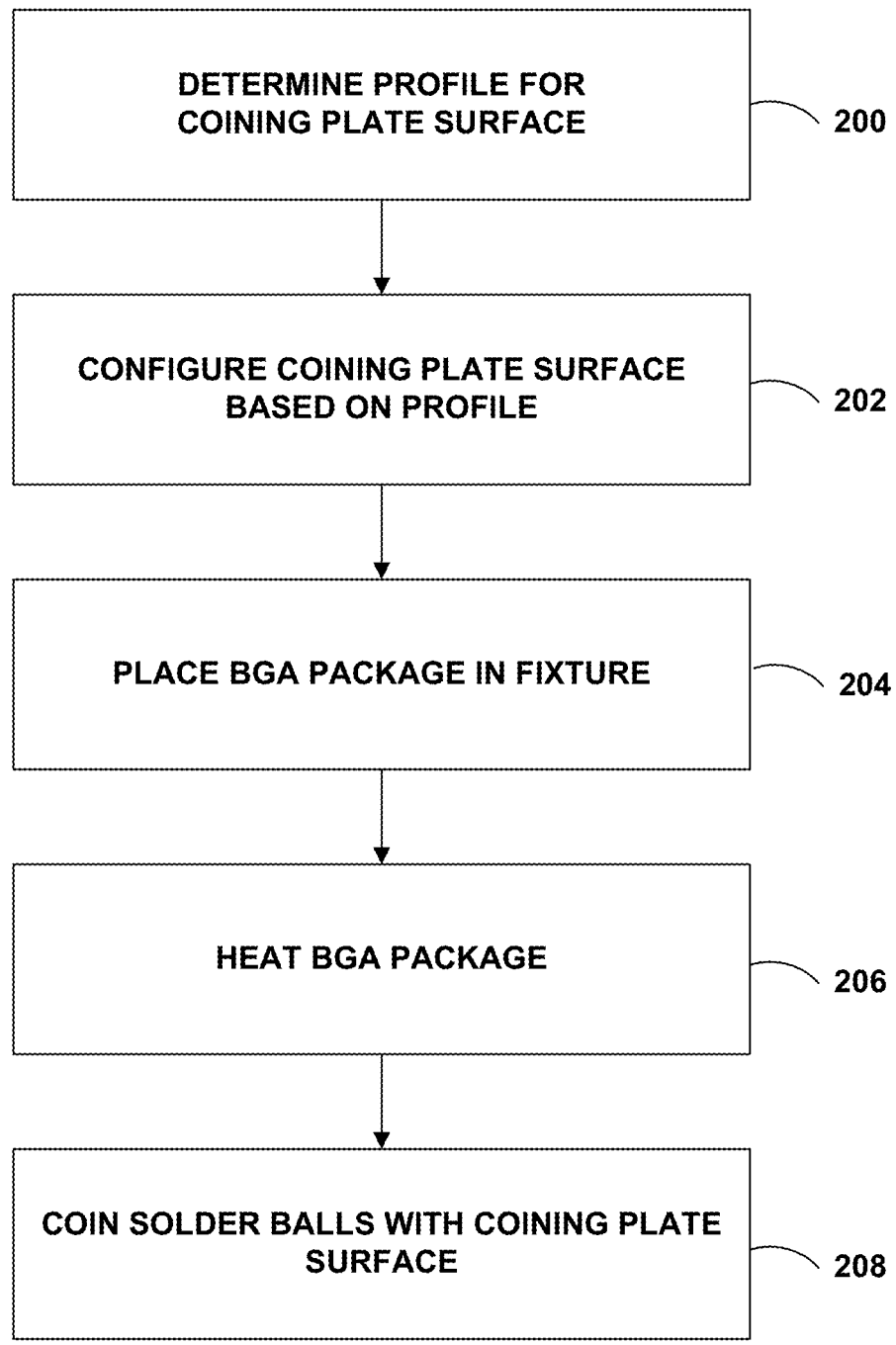
FIG. 5 is a flowchart illustrating another example method of coining, in accordance with techniques of this disclosure.

FIG. 5 is a flowchart illustrating another example method of coining, in accordance with techniques of this disclosure. In the example approach of FIG. 5, coining plate surface 64 is configured based on a profile of the surface to which BGA package 30 is to be attached. In one such example approach, a check is made to determine a profile representative of the surface to which the BGA package will be attached (200). If the surface is PCB surface 68 and the surface forms what is approximately a plane, the profile is planar. If the surface is PCB surface 68 and the surface is convex, the profile is selected to be convex. If the surface is PCB surface 68 and the surface is concave, the profile is selected to be concave. Other, more complex profiles may also be used, as further detailed below.

Coining plate surface is configured as a function of the profile (202). In some example approaches, coining plate surface 64 models PCB surface 68 at a temperature selected to represent normal operation of a device including PCB 44. In some example approaches, coining plate surface 68 models PCB surface 68 at a temperature selected to represent a typical temperature for soldering devices to surface 68 of PCB 44. Other temperatures, such as intermediate or room temperatures, may be selected as well.

BGA package 30 is placed in fixture 52 such that cavity 62 receives IC 32 (204). BGA package is the heated to a desired temperature (206). In some example approaches, the temperature reflects a temperature associated with the site to which BGA package 30 is to be attached. For instance, the temperature may reflect normal operating temperatures for a fully assembled PCB board 44, or the temperature at which devices are soldered to PCB 44, or an intermediate temperature chosen to minimize differences in thermal expansion between BGA package 30 and PCB 44, or to minimize warpage of BGA package 30. Coining plate surface 64 is then pressed against solder balls 48 to transfer the profile to solder balls 48 (208). In some example approaches, the coining process is optimized with parameters such as temperature, pressure and speed of pressure application. In some example approaches, the level of coining may be controlled precisely and may, in some examples, result in solder ball coplanarity at a desired level. In other example approaches, the level of coining may be controlled precisely and may, in some examples, result in solder ball coining consistent with the selected profile.

The techniques described above provide reduction in the effects of warpage on PCB fabrication. In addition, the approaches described above reduce the effects of differences in thermal expansion between the BGA package 30 and PCB 44. Coining offers a straightforward and efficient coplanarity improvement, without requiring packaging design or material changes. In addition, the approaches described above improve warpage performance without the increased thermal stresses of other approaches, which are detrimental to reliable performance. The solid sphere coining method described above eliminates the need for compromising reliability for manufacturability and significantly reduces the time and resources needed for ASIC development.

In addition, high solder ball coplanarity reduces risk of component damage during final test at vendors, as lower forces will be required to make full contact with probe cards. Finally, coined solder spheres will re-melt during board attach reflow and form normal solder joints, and can be performed by ASIC vendors and assembly sites as part of device manufacture.

The invention claimed is:

1. A method comprising:
positioning an integrated circuit package in a fixture, wherein the integrated circuit package includes a substrate, an integrated circuit device disposed on a top surface of the substrate, at least one of a stiffener ring or a lid, and a plurality of solder balls disposed on a bottom surface of the integrated circuit package, wherein the fixture includes a support structure and a cavity that is formed within the support structure, wherein the cavity receives the integrated circuit device while the support structure supports the integrated circuit package along a perimeter of the integrated circuit package at the stiffener ring or the lid,
wherein the stiffener ring or the lid is entirely outside the cavity and on top of the surface of the support structure, and
wherein the substrate is entirely above both the cavity and the support structure, and the plurality of solder balls are exposed above the cavity; and
pressing a pressing plate against two or more of the solder balls, coining the two or more solder balls until each solder ball has a coined surface profile,
wherein the support structure supporting the integrated circuit package along the perimeter of the integrated circuit package at the stiffener ring or the lid that is outside the cavity prevents pressure from the pressing plate from being transferred to the integrated circuit device from the pressing plate.

2. The method of claim 1, wherein the coined surface profile is nonplanar.

3. The method of claim 1, wherein pressing includes applying a predefined amount of pressure to the pressing plate.

4. The method of claim 1, wherein the method further comprises heating the integrated circuit package to reduce warpage.

5. The method of claim 1, wherein pressing includes heating a surface of the pressing plate to a predefined temperature.

6. The method of claim 5, wherein pressing further includes applying a predefined amount of pressure to the pressing plate while pressing against the two or more solder balls.

7. The method of claim 6, wherein the method further comprises heating the integrated circuit package to reduce warpage.

8. A coining apparatus, comprising:
a fixture configured to receive an integrated circuit package having an integrated circuit device connected through a substrate to one or more solder balls and at least one of a stiffener ring or a lid, wherein the integrated circuit device is attached to a top surface of the substrate, wherein the fixture includes a supporting structure and a cavity that is formed within the support structure, wherein the cavity receives the integrated circuit device while the supporting structure supports the integrated circuit package along a perimeter of the integrated circuit package at the stiffener ring or the lid,
wherein the stiffener ring or the lid is entirely outside the cavity and on top of the surface of the support structure, and
wherein the substrate is entirely above both the cavity and the support structure, and the one or more solder balls are exposed above the cavity; and
a pressing plate set opposite the fixture and configured to press against the one or more solder balls to coin the one or more solder balls,
wherein the support structure supporting the integrated circuit package along the perimeter of the integrated circuit package at the stiffener ring or the lid that is outside the cavity prevents pressure from the pressing plate from being transferred to the integrated circuit device from the pressing plate.

9. The coining apparatus of claim 8, wherein the pressing plate includes a pressing plate surface, wherein the pressing plate surface when pressed against the solder balls imposes a profile across the solder balls of the integrated circuit package.

10. The coining apparatus of claim 9, wherein the profile is nonplanar.

11. The coining apparatus of claim 9, wherein the pressing plate surface when pressed against the solder balls imposes a coined surface profile across the solder balls of the integrated circuit package.

12. The coining apparatus of claim 9, wherein the pressing plate surface is nonplanar.

* * * * *